US009081918B2

(12) United States Patent
Yarus et al.

(10) Patent No.: US 9,081,918 B2
(45) Date of Patent: Jul. 14, 2015

(54) METHODS AND SYSTEMS REGARDING MODELS OF UNDERGROUND FORMATIONS

(75) Inventors: Jeffrey M. Yarus, Houston, TX (US); Marko Maucec, Englewood, CO (US); Richard L. Chambers, Bixby, OK (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 13/996,381

(22) PCT Filed: Jan. 27, 2011

(86) PCT No.: PCT/US2011/022659
§ 371 (c)(1),
(2), (4) Date: Jun. 20, 2013

(87) PCT Pub. No.: WO2012/102716
PCT Pub. Date: Aug. 2, 2012

(65) Prior Publication Data
US 2013/0297274 A1 Nov. 7, 2013

(51) Int. Cl.
*G06F 17/50* (2006.01)
*G06T 17/05* (2011.01)
*G01V 1/30* (2006.01)

(52) U.S. Cl.
CPC ............ *G06F 17/5009* (2013.01); *G01V 1/301* (2013.01); *G06T 17/05* (2013.01); *G01V 2210/614* (2013.01); *G01V 2210/66* (2013.01)

(58) Field of Classification Search
CPC .................................................... G01V 1/301
USPC .......................................................... 703/10
See application file for complete search history.

(56) References Cited

U.S. PATENT DOCUMENTS

| | | | | |
|---|---|---|---|---|
| 8,290,711 | B2 * | 10/2012 | Barthelemy et al. | 702/6 |
| 8,352,227 | B2 * | 1/2013 | Klumpen et al. | 703/10 |
| 8,392,165 | B2 * | 3/2013 | Craig et al. | 703/10 |
| 2006/0136162 | A1 | 6/2006 | Hamman et al. | |
| 2007/0005253 | A1 | 1/2007 | Fornel et al. | |
| 2008/0162093 | A1 * | 7/2008 | Nivlet et al. | 703/2 |

(Continued)

OTHER PUBLICATIONS

International Search Report and Written Opinion issued Sep. 28, 2011 in International Application No. PCT/US2011/022659 filed Jan. 27, 2011.

(Continued)

*Primary Examiner* — Aniss Chad

(57) ABSTRACT

Models of underground formations. At least some of the illustrative embodiments are methods including creating a model of an underground formation. The creating may include: calculating a set of probabilities associated with a first horizontal location, each probability indicative of a likelihood of finding abutting geological layers; estimating a plurality of successions of geological layers to create a plurality of estimated successions, and the estimating using the set of probabilities; determining, for each of the estimated succession, a value indicative of how closely each estimated succession matches a measured succession, the measured succession determined by a seismic survey; and selecting from the plurality of estimated successions based on the values, the selecting creates a selected succession of geological layers, and the plurality of modeled values associated with the first horizontal location determined based on the selected succession of geological layers.

29 Claims, 9 Drawing Sheets

(56) References Cited

U.S. PATENT DOCUMENTS

2010/0165791 A1 7/2010 Lie
2010/0309749 A1* 12/2010 Yogeswaren .................. 367/38

OTHER PUBLICATIONS

Leguijt, J. L-35—A Promising Approach to Subsurface Information Integration. EAGE 63rd Conference & Technical Exhibition; Amsterdam, The Netherlands; Jun. 11-15, 2001.

Gunning, J. et al. Delivery: An Open-Source Model-Based Bayesian Seismic Inversion Program. Computers & Geosciences; 30 (2004).

Gunning, J. et al. DeliveryMassager: A Tool for Propagating Seismic Inversion Information Into Reservoir Models. Computers & Geosciences. Preprint. Nov. 6, 2006.

Glinsky, M.E. et al. Integration of Uncertain Subsurface Information Into Multiple Reservoir Stimulation Models. The Leading Edge. Oct. 2005. pp. 990-999.

Gunning, J. et al. Z-99—Bayesian Seismic Inversion Delivers Integrated Subsurface Models. EAGE 65th Conference & Exhibition; Stavanger, Norway; Jun. 2-5, 2003.

Gunning, J. et al. B002—DeliveryMassager—Propagating Seismic Inversion Information Into Reservoir Flow Models. EAGE 68th Conference & Exhibition; Vienna, Austria; Jun. 12-15, 2006.

Leguijt, J. Seismically Constrained Probabilistic Reservoir Modeling. The Leading Edge. Dec. 2009. pp. 1478-1484.

Spikes, K. Statistical Classification of Seismic Amplitude for Saturation and Net-to-Gross Estimates. The Leading Edge. Dec. 2009. pp. 1436-1445.

Michelena, R.J. et al. Constraining 3D Facies Modeling by Seismic-Derived Facies Probabilities: Example from the Tight-Gas Jonah Field. The Leading Edge. Dec. 2009. pp. 1470-1477.

Tuttle, C. et al. A Seismically Constrained Reservoir Modeling Workflow: Case Study. The Leading Edge. Dec. 2009. pp. 1492-1497.

Kalla, S. et al. Imposing Multiple Seismic Inversion Constraints on Reservoir Stimulation Models. SPE 110771. Society of Petroleum Engineers. SPE Annual Technical Conference and Exhibition; Anaheim, California; Nov. 11-14, 2007.

Eide, A.L. et al. Prediction of Reservoir Variables Based on Seismic Data and Well Observations. Journal of the American Statistical Association. vol. 97, No. 457. Mar. 2002.

Eidsvik, J. et al. Seismic Reservoir Prediction Using Bayesian Integration of Rock Physics and Markov Random Fields: A North Sea Example. The Leading Edge. Mar. 2002. pp. 290-294.

O'Halloran, A. et al. Stimulating Geology Using Markov Random Fields: Theoretical Foundations and Practical Considerations. Elsevier. Preprint. Jan. 8, 2008.

Latimer, R.B. e al. An Interpreter's Guide to Understanding and Working With Seismic-Derived Acoustic Impedance Data. The Leading Edge. Mar. 2000. pp. 242-256.

Iverson, W.P. Crosswell Logging for Acoustic Impedance. Journal of Petroleum Technology, Jan. 1988. pp. 75-82.

Mikes, D. Maximum Flooding Surface; The Ultimate Correlator. 11th SAGA Biennial Technical Meeting and Exhibition; Swaziland; Sep. 16-18, 2009. p. 582.

Kindermann, R. et al. Contemporary Mathematics—Markov Random Fields and Their Applications. American Mathematical Society. 1980.

Hastings, W.K. Monte Carlo Sampling Methods Using Markov Chains and Their Applications. Biometrika; vol. 57, No. 1, p. 97-109. 1970.

Clawson, S. et al. Seismic Acoustic Impedance Inversion in Reservoir Characterization Utilizing gOcad. Presented at the 2000 gOcad Users Meeting. 2000.

* cited by examiner

METHODS AND SYSTEMS REGARDING MODELS OF UNDERGROUND FORMATIONS

CROSS-REFERENCE TO RELATED APPLICATIONS

None.

BACKGROUND

In order to optimize borehole placement and hydrocarbon extraction from an underground formation, a model of the formation may be created. Using the model, many simulations may be performed with varying parameters, the varying parameters such as injection well placement, extraction well placement, and type and volume of secondary recovery fluid.

However, creating a model such that the model accurately reflects the underground formation can be a time consuming and complicated task. A model may be initially created using data obtained from seismic surveys, and one or more exploratory boreholes. A model may need to be updated when additional boreholes are drilled, or when further seismic surveys are taken (e.g., time-lapse (4D) seismic). Any advance which shortens the time to create a model, or which helps the models more accurately reflect the underground formation, would thus provide a competitive advantage.

BRIEF DESCRIPTION OF THE DRAWINGS

For a detailed description of exemplary embodiments, reference will now be made to the accompanying drawings in which.

NOTATION AND NOMENCLATURE

Certain terms are used throughout the following description and claims to refer to particular components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Creating a model", with respect to an underground formation, shall include not only the original creation of the model, but shall also include updating an existing model based on additional data (e.g., a seismic survey taken after the model was originally created, data obtained by a borehole drilled after the model was originally created).

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to systems and related methods of creating a model of an earth formation. More particularly, the various embodiments are directed to creating a model of an earth formation based on estimated successions of geological layers (i.e., an estimated series of abutting geological layers), the estimated successions of geological layers based on actual data from one or more actual boreholes. Each estimated succession is then compared to a succession of geological layers as determined by a seismic survey, and an estimated succession that most closely matches a measured succession may be taken as representative of the earth formation at the respective location. The discussion is broken into three sections. First, the discussion orients the reader to the subject matter and terminology. Second, a non-mathematical description of various embodiments is provided. Finally, a more mathematical treatment is provided.

Figure 1:
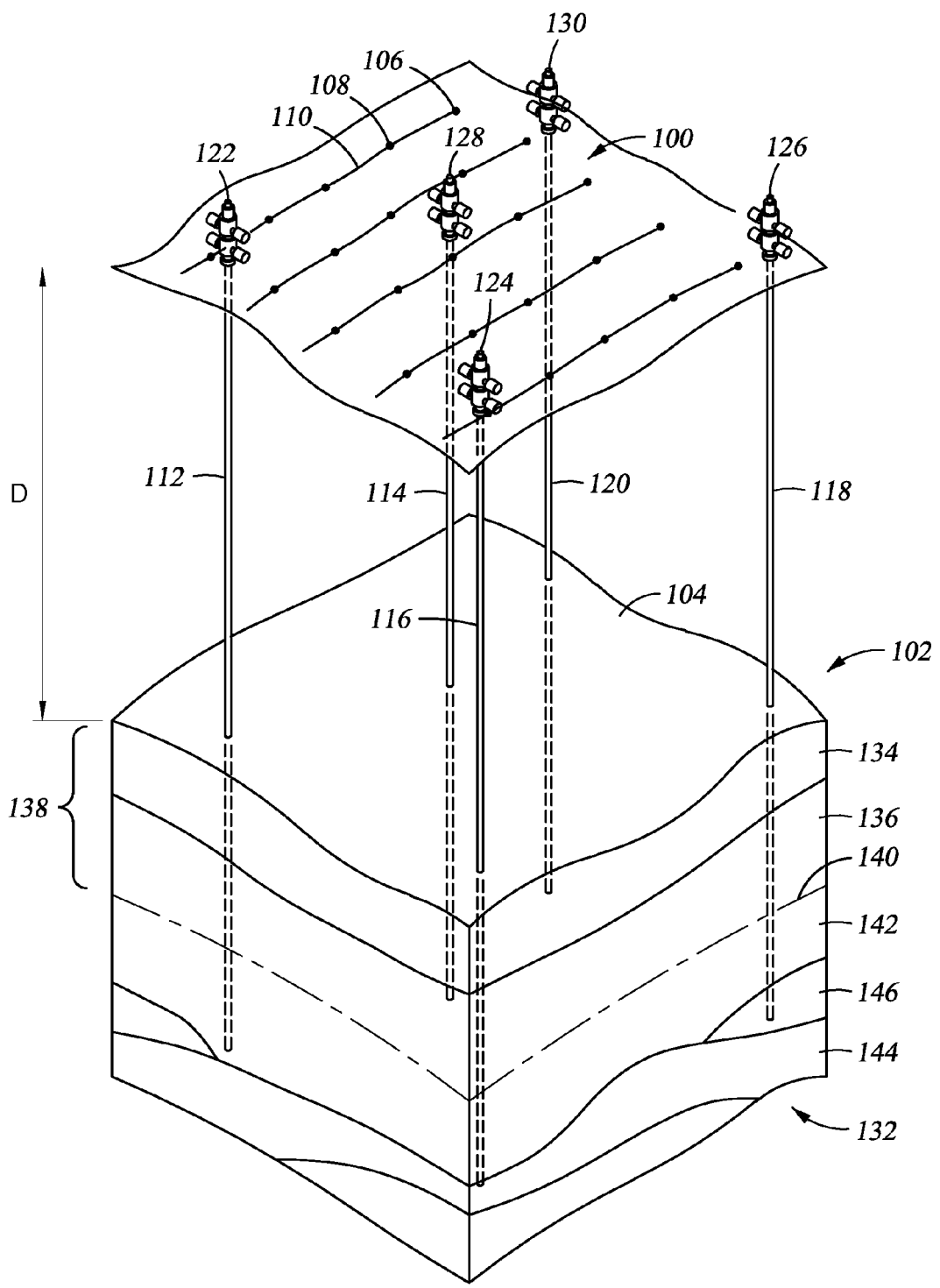
FIG. 1 shows a perspective cut-away view of a hydrocarbon bearing formation.

FIG. 1 shows a cross-sectional perspective view of a portion of the surface of the earth as well as an underlying formation. In particular, FIG. 1 shows a portion of the surface 100 of the earth and an underlying hydrocarbon bearing formation 102 (hereafter just "formation 102"). The formation 102 resides at some distance D below the surface, and the overburden between the surface 100 and the top 104 of the formation 102 is not shown in FIG. 1. The precise shape of the formation 102, while illustrated as approximately rectangular, will in actuality be determined by a variety of factors such as faulting, depositional environment, differential compaction, location of an impervious rock layer above the formation 102, and angle of the impervious rock layer with respect to the surface.

The general shape of the formation 102 may be established by one or more seismic surveys. For example, a plurality of geophones (e.g., geophones 106 and 108) in one or more cables (e.g., cable 110) may be placed along the surface 100. A source of energy, such as from an explosive or from specially designed trucks, creates energy waves that propagate through the overburden and formation 102, with portions of the energy reflecting at each geological boundary. Based on the timing of arrival of reflected energy at the geophones, and the amplitude of such energy, a low vertical resolution, but high spatial resolution, "picture" of the formation 102 may be determined. In many cases, the vertical resolution of a seismic survey may be on the order of approximately 10 feet. In other words, in the array of information that forms the "picture" of the formation 102, a single datum may represent about 10 vertical feet of the formation 102. Thus, while seismic data may cover a broad horizontal area, the vertical resolution of seismic data is low.

In addition to the seismic information, one may also have data regarding the formation 102 from one or more boreholes. For example, boreholes 112, 116, and 118 may be drilled from the surface 100 into the formation 102, either for exploratory purposes, for hydrocarbon extraction, or both. The illustrative boreholes are displayed as vertical, but they can have any geometry. The illustrative boreholes 112, 114, 116, 118, and 120 in FIG. 1 include wellheads 122, 128, 124, 126 and 130, respectively. The wellheads signify that the illustrative boreholes have been completed; however, information regarding the formation 102 may be accumulated at any stage of creation of the illustrative boreholes. For example, while drilling, the drill string may comprise logging tools which measure formation characteristics. Further, during periods of time when the drill string has been removed during the drilling process, or after the boreholes have been completed, the formation 102 may be logged by wireline logging tools lowered into the borehole.

Data obtained by logging tools run within the boreholes have high vertical resolution. In some cases, the resolution of data obtained within a borehole may be on the order one foot resolution, and in some cases six inch resolution. In other words, a datum taken by a logging tool within a borehole may represent one foot of the formation 102, and in some cases a datum may represent six inches of the formation 102. However, while logging tools may provide more accurate information about the formation proximate to the borehole, the spatial coverage is relatively low. For example, in some cases the interrogating energy (of whatever form) may only extend a few feet into the formation surrounding a borehole. Thus, logging data may be high vertical resolution, but low horizontal resolution.

Still referring to FIG. 1, the underground formation 102 may define several features of interest. For example, the top 104 of the formation to the bottom 132 of the formation (or vice versa) may be referred to as a "sequence", with the top 104 and bottom 132 considered the "sequence boundaries". In other cases, a sequence may refer to less than a complete formation. Moreover, within the formation 102 (i.e., between the sequence boundaries), the formation may define one or more "layers", such as layers 134 and 136. The layers may be defined by any suitable property of the rock that makes up the formation, such as differing facies, rock types, varying rock physical characteristics (e.g., porosity, permeability), or varying rock mechanical characteristics (e.g., brittleness, Young's modulus).

A group of layers may be referred to as an "interval". For example, layers 134 and 136 considered together may be an interval 138. Further, one or more of the interfaces between layers may be of particular interest. For example, the interface 140 (shown in dash-dot-dash line) between layer 136 and 142 may represent a surface of deposition at the same time that the shoreline is at its maximum landward position, the time of maximum transgression. Such a surface could be referred to as "maximum flooding surface". Other surfaces of interest can include sequence boundaries and transgression surfaces or any type of surface that is used in described sequence-stratigraphy geometries. Finally, the term "succession of geological layers" refers to a pattern of abutting layers. For example, the succession of geological layers at the borehole 118 within the formation 102 (considered from the bottom to the top) in the illustration of FIG. 1 refers to layers 144, 146, 142, 136, and then 134. In the example situation of FIG. 1, a different succession of geological layers exists at the location of borehole 116 than at the borehole 118.

Figure 2:
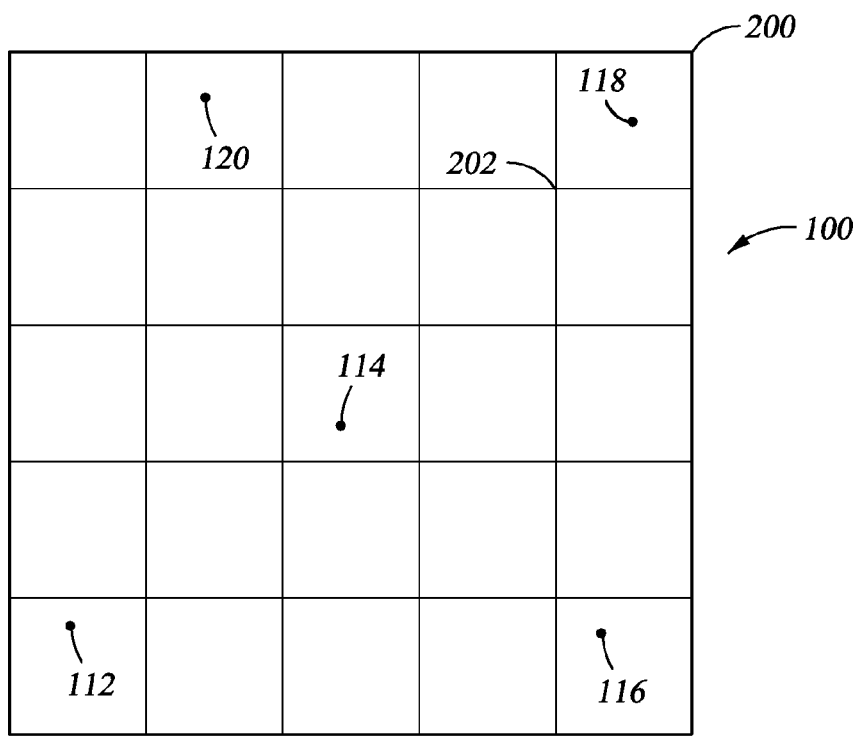
FIG. 2 shows a combination side elevation view of the formation, and overhead view of the surface.
Figure 2:
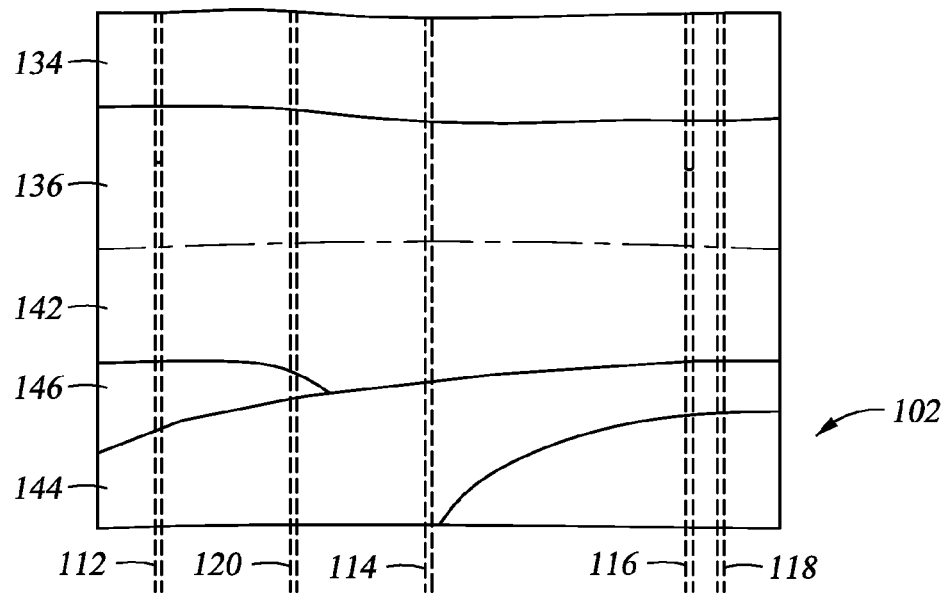

In accordance with at least some embodiments, locations within the formation (and possibly corresponding locations within the model) are identified based on the combination of a horizontal location and a depth. FIG. 2 shows a side view of illustrative formation, along with an overhead view of the surface comprising grid layout. In particular, FIG. 2 shows a side elevation view of formation 102, along with the surface 100 having a grid pattern superimposed thereon. The surface 100 shown in an overhead view is aligned horizontally with the formation 102. FIG. 2 also shows the horizontal location of the illustrative boreholes by way of dashed lines. In particular, FIG. 2 shows the horizontal location of illustrative boreholes 112, 114, 116, 118, and 120. Dashed lines running through the formation 102 depict the location boreholes as seen from the viewing position of FIG. 2. Each corner and/or intersection of the grid pattern defines a horizontal location (i.e., an XY location) on the surface 100. For example, corner 200 defines a first location, and intersection 202 of the grid pattern defines a second horizontal location. It should be understood that the grid pattern is a mathematical creation, and shall not be read to require actual grid-lines created on the surface 100. Each corner and/or intersection may be referred to in the industry as a common depth point (CDP). For example, location 200 is a CDP location, and location 202 is a CDP location. Depths are references by a CDP location and the elevation or depth below the surface (or some other convenient measure, such as elevation above or below the maximum flooding surface). Thus, a particular point within the formation 102 may be explicitly located by the combination of a CDP location and a depth value.

Figure 3:
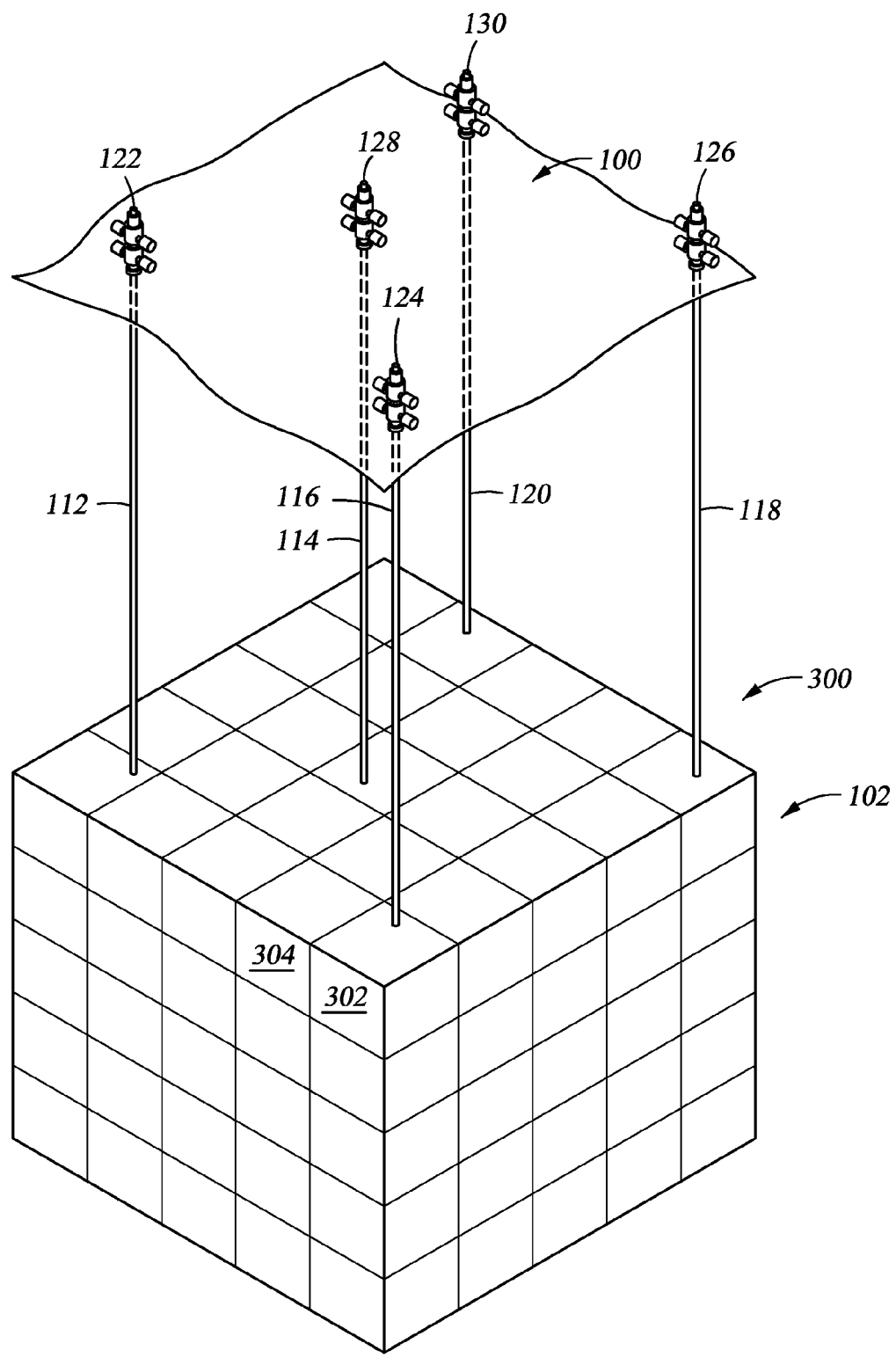
FIG. 3 shows a perspective view of a model of a hydrocarbon bearing formation.

Some or all of an underground hydrocarbon bearing formation may be modeled by the use of a geocellular model. FIG. 3 shows a perspective view of an illustrative geocellular model. In particular, FIG. 3 shows the surface 100, as well as a geocellular model 300 of the formation 102. As the name implies, a geocellular model comprises a plurality of cells (e.g., cell 302, and cell 304) where all the cells considered together approximate the physical extent of the formation 102 (or a relevant section). As illustrated in FIG. 2, the cells 302 and 304 are rectangular, and all the cells are of approximately equal volume; however, shape of the cells, and volume represented by each cell, may change for each particular situation. For example, in portions of the formation known to have significant hydrocarbon impregnation, the cell volumes may be relatively small so that hydrocarbon movement may be more accurately modeled or simulated. Locations in the formation that have very little hydrocarbon impregnation, or which are a great distance from planned or actual injection wells and/or extraction wells, may have larger volume as the precise hydrocarbon movement through these cells may have less of an impact on the overall simulation.

It is to be understood that each cell (e.g., cells 302 and 304) is a mathematical construct, not a physical construct. The illustration of FIG. 3 showing the model 300 under the surface 100 is merely to orient the reader to the idea of a geocellular model representing or modeling a formation 102. Each cell "contains" or is made up of information regarding the portion of the formation represented by the cell. For example, each cell may contain a value indicative of the porosity of the formation represented by the cell. Each cell may contain an indication of the permeability of the formation represented by the cell. Each cell may contain an indication of hydrocarbon saturation of a portion of the formation represented by the cell. Each cell may contain an indication of the oil-to-gas saturation of the portion of the formation represented by the cell. The cells may align with the grid used to define the CDP locations (i.e., the corners of the cells align with the CDP locations), or the CDP locations may align with the center of each cell. In other cases, the cells and CDP locations may be misaligned. Using the model 300 then, response of the formation 102 may be simulated for many different extraction techniques. For example, the model 300 may be used to estimate the volume of fluid extracted from borehole 112 in response to pumping of a secondary recovery fluid into the formation through borehole 116.

The specification now turns to a non-mathematical description of creating a model of an earth formation in accordance with at least some embodiments. As mentioned above, data associated with a seismic survey have high horizontal resolution, but low vertical resolution. Data associated with logging tools used within boreholes have low horizontal resolution, but high vertical resolution. Thus, at the locations of boreholes into the formation, high vertical resolution information about formation is known. At CDP locations that do not correspond to locations of a borehole, only the low vertical resolution seismic information is known. The various embodiments are directed to calculating sets of high vertical resolution data at each CDP location based on actual data from the actual boreholes. From the sets of high vertical resolution data, one set is selected to represent the formation at the particular CDP location, and the selection is based on comparison of each set of the high resolution data to the data associated with the seismic survey. An initial step in creating the sets of high resolution data at each CDP location is the concept of a vertical transition probability.

Figure 4:
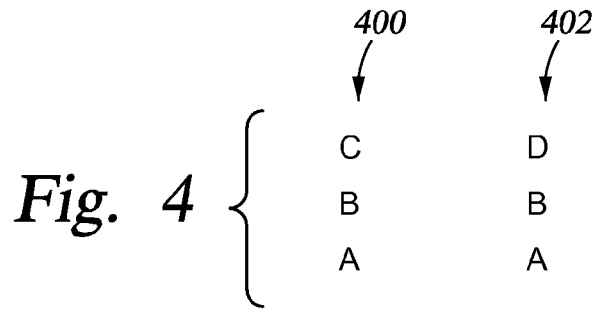
FIG. 4 shows an example succession of geological layers in accordance with at least some embodiments.

In accordance with particular embodiments, creating the sets of high resolution data at each CDP location initially involves determining what the inventors herein have termed a "vertical transition probability". More particularly, the succession of geological layers at each actual borehole is known, and from the known succession of geological layers at the actual boreholes probabilities are calculated, where the probabilities are indicative of the likelihood of finding abutting geological layers. Consider, for purposes of discussion, the simplified situation of FIG. 4. In particular, FIG. 4 illustrates a succession of geological layers encountered by way of a first borehole 400 and a second borehole 402. In the case of borehole 400, from the bottom the succession of geological layers is: geological layer A abutting geological layer B abutting geological layer C. In borehole 402, again from the bottom, the succession of geological layers is: geological layer A abutting geological layer B abutting geological layer D. From the successions of geological layers considering both actual boreholes, a set of probabilities may be calculated. For the illustrative four geological layers, the set of probabilities takes the form:

$$\{P(A|B), P(A|C), P(A|D), P(B|C), P(B|D), P(C|D)\} \quad (1)$$

where P(A|B) is the probability that geological layer A abuts geological layer B, P(A|C) is the probability that geological layer A abuts geological layer C, P(A|D) is the probability that geological layer A abuts geological layer D, P(B|C) is the probability that geological layer B abuts geological layer C, P(B|D) is the probability that geological layer B abuts geological layer D, and P(C|D) is the probability that geological layer C abuts geological layer D. In this example, and so as not to unduly complicate the discussion, it is assumed that the probabilities are insensitive to direction abutment, such that P(A|B) is the same as P(B|A), and thus a separate entry for P(B|A) is not included. Moreover, following the notion of "vertical transition probability", if a given facies (or rock type) is repeating over multiple consecutive layers, that transition is not accounted for in the example.

Using the illustrative succession of geological layers of FIG. 4 (four total layers, and two boreholes), the illustrative set of probabilities would be:

$$\{P(A|B)=1, P(A|C)=0, P(A|D)=0, P(B|C)=0.5, P(B|D)=0.5, P(C|D)=0\} \quad (2)$$

For example, geological layer A abuts geological layer B in both borehole 400 and borehole 402. In this example at a CDP location in proximity to illustrative boreholes 400 and 402, if geological layer A is present, the probability of geological layer A abutting geological layer B is 1.0. In the illustrative situation of FIG. 4, geological layer B abuts geological layer C in borehole 400, but geological layer B abuts geological layer D in borehole 402, and thus in this example at a CDP location in proximity to illustrative boreholes 400 and 402, if geological layer B is present, the probability of geological layer B abutting geological layer C is 0.5, and the probability of geological layer B abutting geological layer D is also 0.5. Before proceeding, it should be understood that the situation of FIG. 4 is simplified to convey the concepts of vertical transition probability. In practice, more than three geological layers may be present, and more than two actual boreholes may be used, and thus the set of vertical transition probabilities may be of significant size. Moreover, the illustrative probabilities above do not consider directional sensitivity, and in practice directional sensitivity as to the probability of geological layers abutting may be taken into account (i.e., a different probability for P(A|B) then P(B|A)).

In some cases, the vertical transition probabilities are calculated using the actual succession of geological layers from all the actual boreholes into the formation, and the set of probabilities are thus used for each CDP location. In other cases, the set of probabilities may be calculated using a smaller subset of the data from actual boreholes, for example only actual boreholes within a predetermined distance of the CDP location. In yet still other cases, the set of probabilities may be adjusted based on the horizontal distance of the CDP location from the actual boreholes. For example, for a CDP location very close to illustrative borehole 400, the set of probabilities may be more heavily weighted based on the succession of geological layers in the borehole closest to the CDP location. Determining the set of probabilities weighted for proximity of the CDP location to the actual boreholes may take any suitable form, such as an interpolation technique (e.g., Kriging).

Once a set of probabilities are determined for a CDP location, a plurality of succession of geological layers are estimated (i.e., "estimated successions"), where the estimated successions are calculated using the set of probabilities. More particularly, from a point at which the geological layer is known (e.g., the top, bottom, or the maximum flooding surface), a succession of geological layers is estimated. Consider, as an example, a CDP location in proximity to the illustrative boreholes 400 and 402, and further consider the starting point for the succession is layer A. Using the probabilities from equation (2) above, the following plurality of successions may be estimated: {A, B, C}, and {A, B, D}.

After estimating the plurality of successions, a thickness of each geological layer in each estimated succession may be determined. Estimating the thickness of each geological layer within each estimated succession may take any suitable form. In a particular embodiment, the actual thickness of each geological layer in each actual borehole (or each actual borehole used to create the set of probabilities) is determined. For example, the thicknesses of geological layers A, B, and C in illustrative borehole 400 are determined, and the thicknesses of geological layers A, B, and D in illustrative borehole 402 are determined. Using the thicknesses determined, statistical sampling (e.g., Monte Carlo analysis) may be used to estimate the thickness of each geological layer at the CDP location. In other embodiments, any suitable interpolation technique may be used to estimate the thickness of each geological layer at the CDP location.

In addition to the estimating thickness of each geological layer at the CDP location, an estimate of the porosity of each geological layer at the CDP location may be determined. Estimating the porosity of each geological layer within each estimated succession may take any suitable form. In a particular embodiment, the actual porosities of each geological layer in each actual borehole (or each actual borehole used to create the set of probabilities) are determined. For example, the porosities of geological layers A, B, and C in illustrative borehole 400 are determined, and the porosities of geological layers A, B, and D in illustrative borehole 402 are determined. Using the porosities determined, statistical sampling (e.g., Monte Carlo) may be used to estimate the porosity of each geological layer at the CDP location. In other embodiments, any suitable interpolation technique may be used to estimate the porosity of each geological layer at the CDP location. In a particular embodiment the statistical sampling (e.g., Monte Carlo) may simultaneously estimate thickness and porosity.

Further, an estimate of the density and speed of sound (i.e., sonic velocity) of each geological layer may be determined. Estimating the density and sonic velocity of each geological layer within each estimated succession may take any suitable form. In a particular embodiment, the actual density and actual sonic velocity of each geological layer in each actual borehole (or each actual borehole used to create the set of probabilities) are determined. Using the actual density and sonic velocity, any suitable interpolation technique may be used to estimate the density and sonic velocity of each geological layer at the CDP location.

Having now estimated thickness, porosity, density and sonic velocity of each layer of the estimated succession at the particular CDP location, an acoustic impedance trace may be calculated for each estimated succession. That is, the acoustic impedance of each layer of each estimated succession is calculated, resulting in an acoustic impedance trace for each estimated succession. In the example discussed above having illustrative boreholes 400 and 402, and four geological layers, two acoustic impedance traces are calculated. Before proceeding, it should be understood that the acoustic impedance traces calculated for each estimated sequence are high resolution data. That is, the acoustic impedance traces will have the same or substantially the same vertical resolution as data from the actual boreholes.

The next step in the illustrative process is selecting from the estimated successions a succession of geological layers which is most likely to accurately represent the formation at the particular CDP location. In a particular embodiment, selecting from the estimated successions involves determining, for each estimated succession, a value indicative of how closely the estimated succession matches a measured succession, the measured succession such as a low vertical resolution succession of geological layers as determined by a seismic survey.

However, a measured succession based on a seismic survey has low vertical resolution; whereas, the each estimated succession has high vertical resolution. Thus, in order to make the comparison, the data within each estimated succession may be smoothed or averaged and calibrated such that the resolution of the data substantially matches the resolution of the measured succession. Based on the comparison, each estimated succession will have its respective value indicative of how closely the estimated succession matches the measured succession, and the estimated succession that most closely matches the measured succession may be selected. It is noted that, after the comparisons, the averaging used to make the resolutions similar is discarded, and what remains is the high resolution version of the selected succession. Modeled values at the CDP location are thus based on the high resolution data from the selected succession.

This discussion to this point has been with respect to a single CDP location. However, the process may be repeated at each CDP location (or each CDP location of interest less than all CDP locations) such that a selected succession exists for each CDP location of interest. From the selected successions, the model may be created using the high resolution data. The discussion now turns to a more mathematical description of the various embodiments. The discussion that follows is somewhat repetitive in view of the non-mathematical description above, but also presents further information not discussed in the non-mathematical description.

Figure 5:
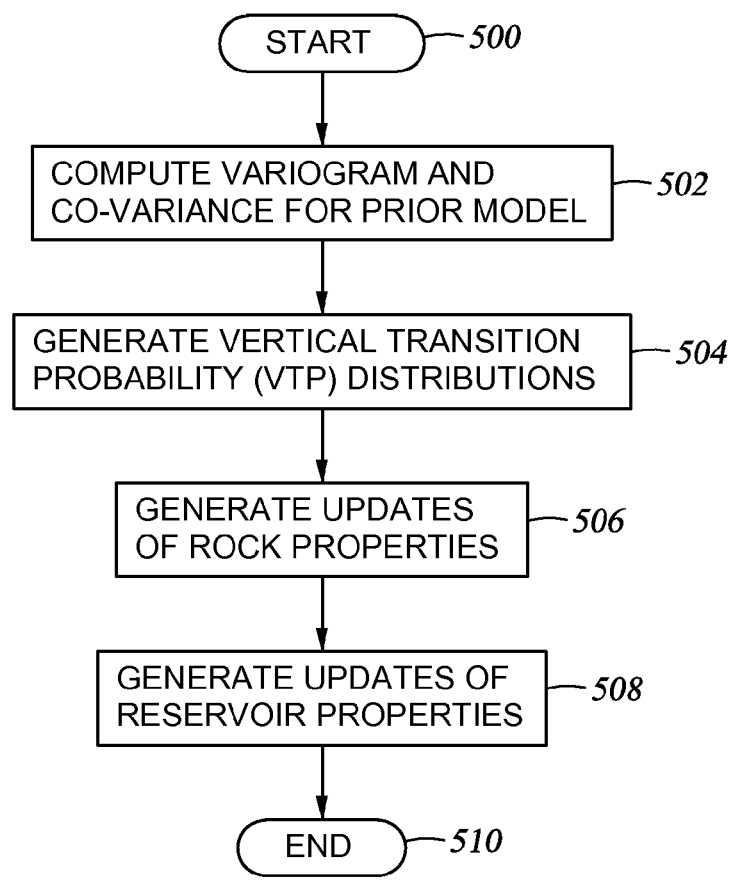
FIG. 5 shows a high level overview of methods in accordance with at least some embodiments.

FIG. 5 shows a high level flow diagram of method in accordance with at least some embodiments. In particular, the method starts (block 500) and proceeds to computing variogram and co-variance for a prior model (block 502). As will be discussed more thoroughly with respect to FIG. 6, the steps represented by block 502 are a precursor to calculating the vertical transition probabilities. Next, the illustrative method comprises generating vertical transition probability distributions (block 504). As will be discussed more thoroughly with respect to FIG. 7, the steps represented by block 504 create the vertical transition probabilities (i.e., histograms for probability distribution functions) that define the probability of finding abutting geological layers (i.e., the probability of finding abutting facies). Next, the illustrative method comprises generating updates of rock properties (block 506). As will be discussed with respect to FIG. 8, the steps represented by block 506 compare the high resolution data created for each CDP location to the measured data, and select sets of data to be used for creation of the model. Next, the illustrative method comprises updating reservoir properties (block 508). As will be discussed with respect to FIG. 9, the steps represented by block 508 create the model using the selected data. Thereafter, the method ends (block 510).

Figure 6:
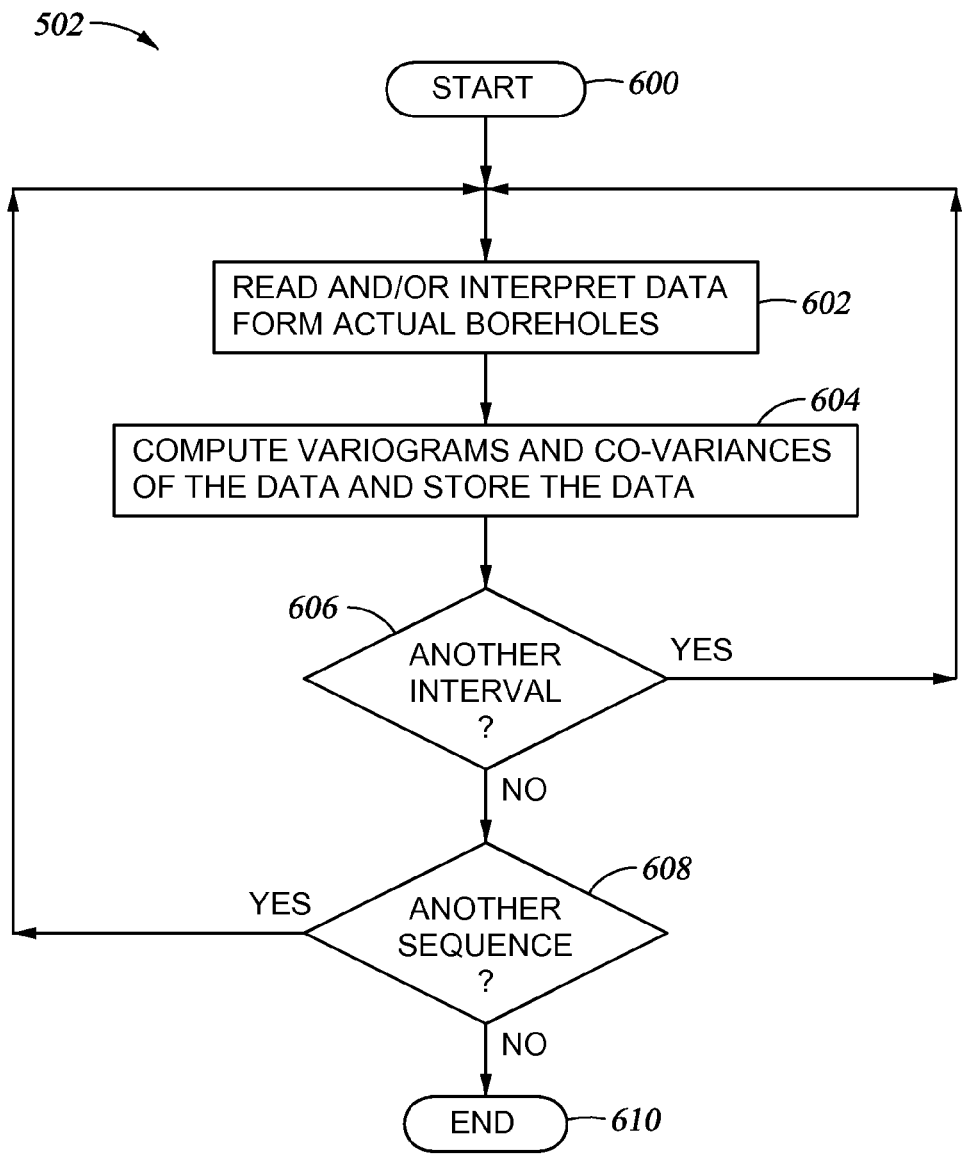
FIG. 6 shows a method in accordance with at least some embodiments.

FIG. 6 shows a more detailed flow diagram of illustrative steps involved in computation of the variogram and co-variance (block 502). The flow diagram of FIG. 6 is with respect to a single CDP location. The illustrative steps of FIG. 6 will be repeated for each CDP location of interest, and in some cases all CDP locations. The illustrative method starts (block 600) and proceeds to reading and/or interpreting data from actual boreholes (block 602). In a particular embodiment, the data of interest are those directly or indirectly indicative of porosity, density, and sonic velocity (for calculation of the acoustic impedance trace). In some cases, the porosity, density, and sonic velocity are directly measured within the actual boreholes, and thus may be directly read within data associated with the actual boreholes. In other cases porosity, density, and sonic velocity may need to be calculated from the data actually measured within the boreholes.

The illustrative method then proceeds to computation (and storage) of the variograms and co-variances of the data from the actual boreholes to the prior geological model, in reference to the CDP location (block 604). A variogram is a function that describes the spatial dependence of variables. Co-variance is a measure of how two variables change together along a particular direction. In the particular case, each covariance characterizes the spatial continuity and directionality between data from an actual borehole and the seismic property in the prior geological model. One having ordinary skill knows how to determine a variogram and co-variance, and now understanding application to the particular situation could calculate such functions. In a particular embodiment, the reading and/or interpreting of data from the actual boreholes (block 602) and the calculating of the variogram and co-variance (block 604) is with respect to a particular interval, where there may be multiple intervals with a sequence. While the illustrative interval 138 of FIG. 1 is approximately horizontal, in many situations an interval may have significant dip (i.e., change in depth with changing horizontal location). Thus, in a particular embodiment the variogram and co-variance are calculated taking into account the physical relationship of the interval. Thus, a determination is made if further intervals are present with the sequence (block 606). If so, the reading and computational steps are repeated for the further intervals.

Although the discussion with respect to FIG. 1 shows only a single sequence, it is possible that a formation of interest may be logically broken into multiple sequences. Thus, if there are further sequences (block 608), the reading and computational steps are repeated for the further sequences, which further sequences may comprise multiple intervals. Thereafter, the illustrative method ends (block 610). Although the discussion with respect to FIG. 6 is with respect to a single CDP location, the various steps are repeated for some or all the CDP locations.

Figure 7:
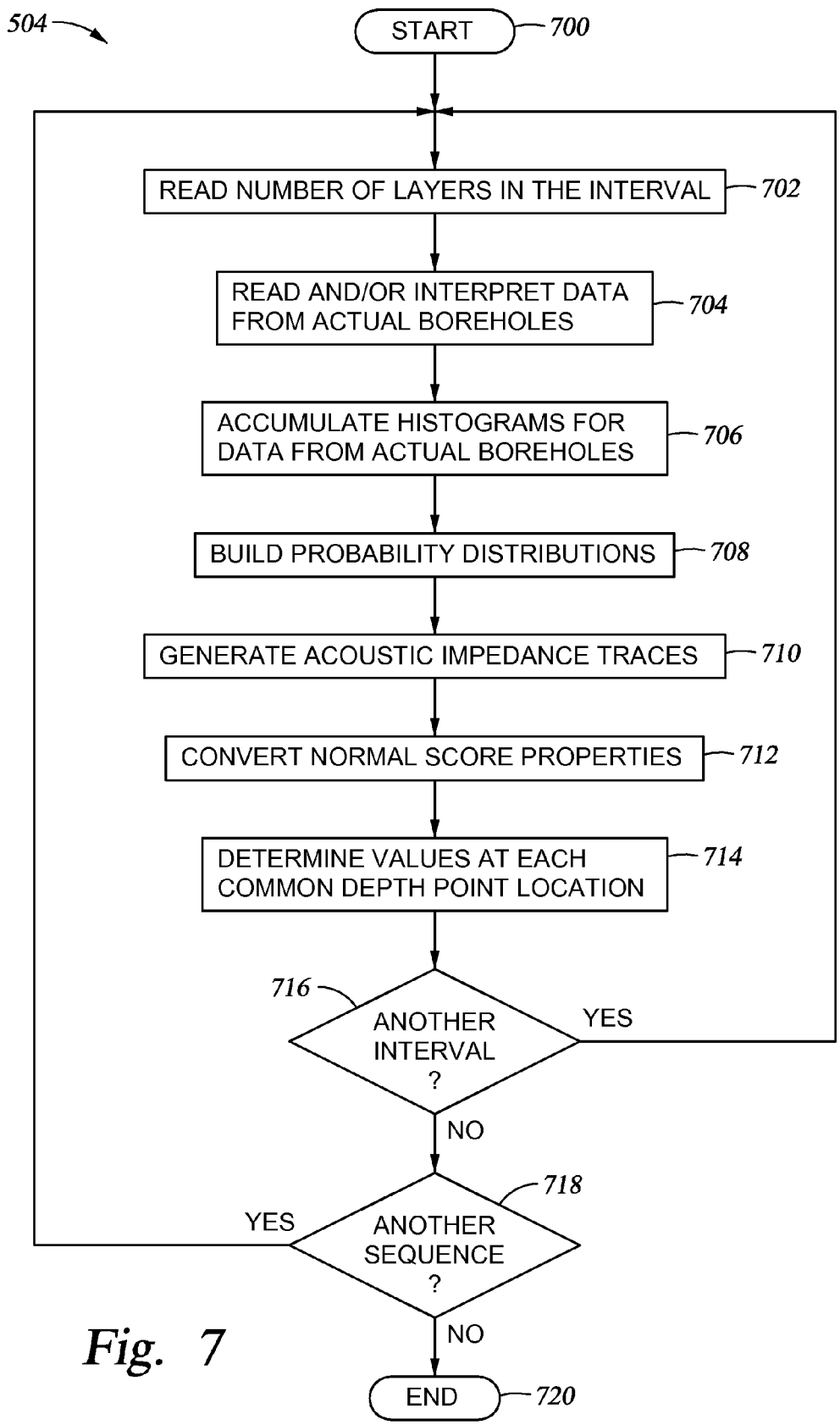
FIG. 7 shows a method in accordance with at least some embodiments.

The next step in the illustrative process is the generation of the vertical transition probability distributions (block 504). FIG. 7 shows a more detailed flow diagram of the illustrative steps involved in generation of the vertical transition probabilities distributions in accordance with at least some embodiments. In particular, the method starts (block 700) and proceeds to reading the number of layers in the interval (block 702). Thereafter, method comprises reading and/or interpreting actual data from boreholes (block 704) for the interval, and layer within the interval, under consideration.

Next, histograms for some or all the data from the actual boreholes are accumulated (block 706). The histograms associated with block 706 may take many forms, depending on the type of data available for each actual borehole. In order to later calculate the acoustic impedance traces, what are ultimately desired are thickness, density, and sonic velocity of each layer. With respect to density, depending on the type of logging tools run through the actual borehole, density may be directly available (e.g., density read by a gamma tool), or may be calculable from other readings (such as based on porosity readings from a neutron tool). With respect to sonic velocity, depending on the type of logging tools run through the actual borehole, sonic velocity may be directly available (e.g., sonic velocity as read by a sonic tool), or may be calculable from other readings. Moreover, the term "histogram" in this context shall mean a representation of the distribution of the data, but shall not be read to require a visual representation. That is, data from which a visual representation of a histogram may be calculated shall still be considered a histogram for purposes of this specification and claims.

The next step in the illustrative method is building of probability distributions (block 708). The probability distributions in block 708 may be not only vertical transition probability, but may include any other data of interest, such as probability distributions for porosity, thickness, and density. As discussed in the non-mathematical section above, the vertical transition probability is a probability of finding abutting geological layers. The various data from the actual boreholes discussed with respect to blocks 704 and 706 are not needed in building of the vertical transition probability, except insofar as to identify to the particular layers. Thus, in some embodiments building the vertical transition probability distribution of block 708 may be accomplished before the previously recited steps so long as the layers are identified in some form. In some embodiments, the vertical transition probability may be expressed as:

$$p^i(l) = p^i(l|(l-1),(l-2),(l-3)\ldots) = p^i((l)|(l-1)) \quad (3)$$

Where p is the vertical transition probability, i is an index over the actual borehole location (e.g., $p^1$ is the probability distribution for actual borehole 1), l is the layer index. In words then, a probability $p^i$ is calculated for each actual borehole i across each layer. Thus, equation (3) takes the form of Markov chain, where the transition matrix defines conditional probability of variable at layer l, given the variable at layer l−1. In other case, the vertical transition probabilities could be generated in the form of Embedded Markov Chains (EMC). Markov chains are sensitive to the selection of the sampling interval, which is proportional to the thickness of each layer. The difference between Markov chains and EMC in the context of the current embodiments is most noticeable in the cases of changes of state (e.g., a layer that is not present in an actual borehole) versus continuous change of layers, where, for example, the correlation between consecutive layers (of fairly constant thickness) is assumed. In cases of very thick layers (such as thick shale layers) that alter the continuous approach to creating the vertical transition probabilities, EMCs may be implemented.

The next step in the illustrative method is to generate acoustic impedance traces (block 710). Acoustic impedance is the product of sonic velocity and density, and mathematically is represented as:

$$AI = v_p \times \rho \quad (4)$$

where AI is acoustic impedance, $v_p$ is sonic velocity, and $\rho$ is density. Thus, the acoustic impedance is calculated using data obtained in blocks 702 and 704. One having ordinary skill understands how to calculate acoustic impedance given density and sonic velocity, and so as not to unduly complicate the discussion further details are omitted. Moreover, the acoustic impedance is calculated for each individual layer.

The next illustrative step is (optionally) converting the data created into a "normal score" form (block 712). Normal score form is a mathematical term of art that means the data has a mean of zero and a standard deviation of one. The conversion to normal score form is a precursor to distributing the data calculated to each CDP location by way of geostatistical simulations. That is, the data calculated in the illustrative method of FIG. 7 is with respect to well locations, not CDP locations. If the data is to "spread out" to each CDP location by way of a simulation technique, the normal score form of the data is needed. On the other hand, the data may be "spread out" to the CDP locations by other techniques, such as interpolation techniques (e.g., Kriging), in which case the normal score form is not necessarily needed.

As alluded to in the paragraph above, from the data calculated with respect to each actual borehole location, the next step in the illustrative method is determining values at each CDP location (block 714) based data calculated with respect to the actual borehole locations. Although versions of all the data may be determined for each CDP location, in accordance with particular embodiments at least the acoustic impedance of the layers are determined for each CDP location. Determining the values at each CDP may be accomplished by simulation techniques, or by interpolation techniques (e.g., Kriging).

By definition, a sequence comprises multiple intervals, and thus if there are further intervals (block 716), in the sequence, the various illustrative steps are repeated for the further intervals. Moreover, there may be multiple sequences to be considered (block 718), and the reading and computational steps are repeated for the further sequences, which further sequences may comprise multiple intervals and multiple layers in each interval. Thereafter, the illustrative method ends (block 720).

Figure 8:
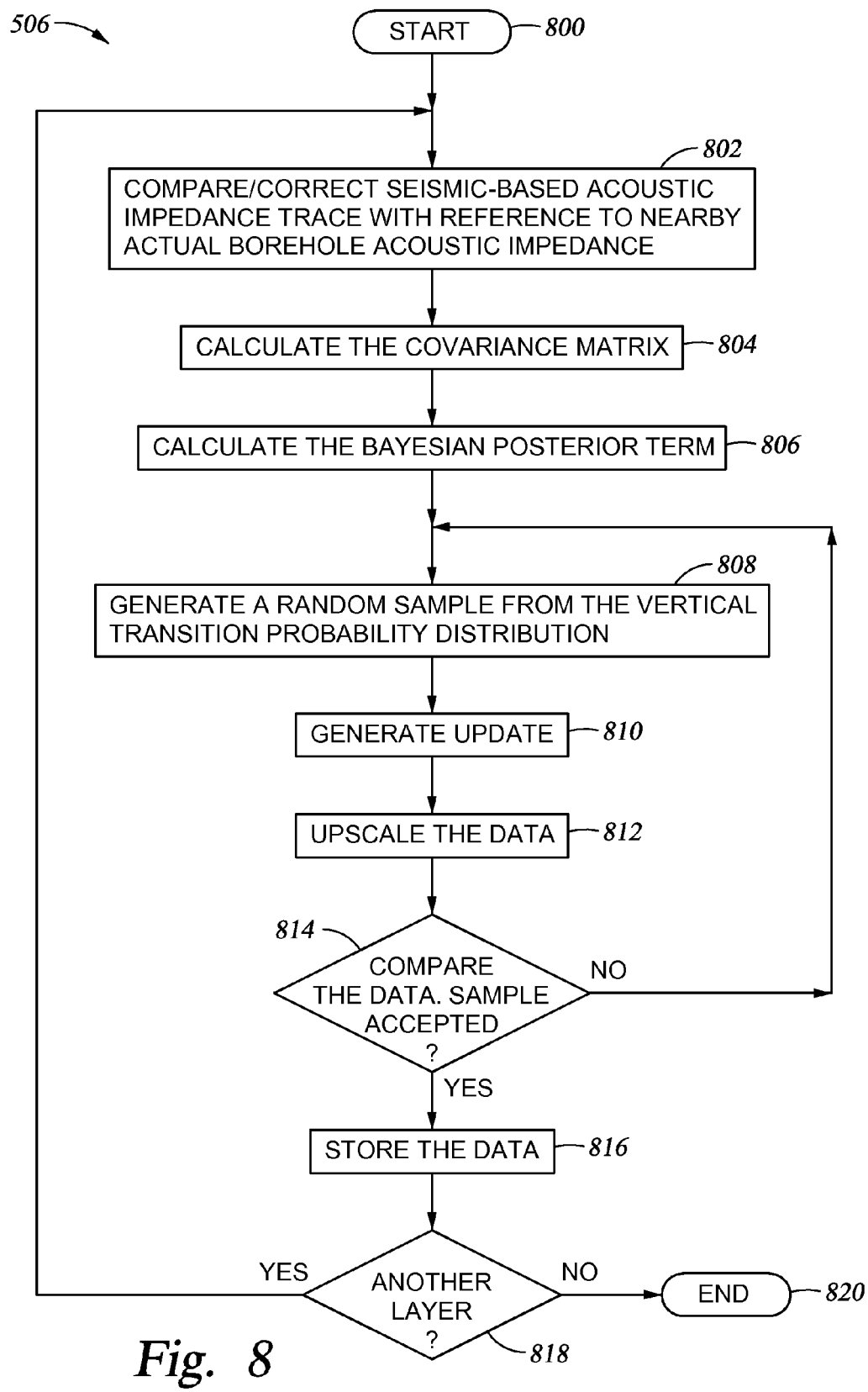
FIG. 8 shows a method in accordance with at least some embodiments.

The next step in the illustrative process is the generation of updates of rock properties (block 506). FIG. 8 shows a more detailed flow diagram of the illustrative steps involved in generation of updates of the rock properties in accordance with at least some embodiments. In particular, the method starts (block 800) and proceeds to a comparison of the seismic-based acoustic impedance trace with reference to a nearby actual acoustic impedance (block 802), as a quality control step. That is, as between a seismic-based acoustic impedance trace ($AI_s$) for a particular layer l at the particular CDP location and a nearby actual borehole location (keeping in mind that an actual borehole will rarely directly fall on a CDP location), a determination is made as how to closely the seismic-based acoustic impedance trace matches. For example, a misfit calculation may take the form:

$$\Delta AI = AI_{i,l} - AI_{sj,l} \quad (5)$$

where $\Delta AI$ is the misfit, $AI_i$ is the closest actual borehole data, j is the particular CDP location, and l is the layer. Corrections may be made to the seismic-based data if the $\Delta AI$ exceeds a predetermined threshold. If there is high confidence that the seismic based acoustic impedance information matches the acoustic impedance information from the actual boreholes, then illustrative block 802 may be omitted.

Next, the illustrative method proceeds to calculation of a covariance matrix $C_D$, which covariance matrix quantifies the linear correlation between the acoustic impedance at an actual borehole to the seismic-based acoustic impedance. In some embodiments, the covariance matrix may be calculated as:

$$C_D(AI, AI_s) = \frac{\sum_{j=1}^{N_{CDP}} (AI_j - m_{AI})(AI_{sj} - m_{AI_s})}{N_{CDP} - 1} \quad (6)$$

where $N_{CDP}$ is the number of CDP locations, $m_{AI}$ is the mean value of the acoustic impedance at the actual borehole, and $m_{AI_s}$ is the mean value of the seismic-based acoustic impedance at the particular CDP location.

With misfit and covariance matrix, the next step in the illustrative method is calculation of the Bayesian posterior term (block 806). In a particular embodiment, the Bayesian posterior term may be calculated by first calculating the normalized Bayesian likelihood term:

$$p_{d|m}(d \mid m) = \frac{1}{(2\pi)^{N_{CDP}/2}|C_D|^{1/2}} \exp\left[-\frac{1}{2}(d-g(m))^T C_D^{-1}(d-g(m))\right] = = \frac{1}{(2\pi)^{N_{CDP}/2}|C_D|^{1/2}} \exp\left[-\frac{1}{2}(\Delta AI)^T C_D^{-1}(\Delta AI)\right] \quad (7)$$

where $p_{d|m}$ is the normalized Bayesian likelihood term, d is a vector of acoustic impedance values calculated from the actual borehole data, g(m) is a vector of seismic-based acoustic impedance values, and T is the mathematical symbol for the matrix transpose operation. Next, the Bayesian prior term may be calculated:

$$p_m(m) = \frac{1}{(2\pi)^{N/2}|C_M|^{1/2}} \exp\left[-\frac{1}{2}(m-m^0)^T C_M^{-1}(m-m^0)\right] \quad (8)$$

where $p_m$ is the Bayesian prior term, and N corresponds to $N_X * N_Y * N_Z$, and $C_M$ is the model covariance. The definition of the Bayesian posterior term follows the notation:

$$p_{m|d}(m \mid d) = \frac{p_{d|m}(d \mid m) * p_m(m)}{p_d(d)} \quad (9)$$

where $p_{m|d}$ is the Bayesian posterior term, and $p_d(d)$ is the probability associated with the data. The $p_d(d)$ term is independent of the model parameters, and is usually treated as a constant.

Once the Bayesian posterior term is calculated, a random sample is drawn from the vertical transition probability distribution (block 808) previously determined. In other words, working through the vertical transition probabilities, an estimated succession of layers is created. Next, an update is generated based on the seismic-based acoustic impedance data (block 810). Mathematically the updated may be expressed as:

$$g^* = g_j + \delta \epsilon \quad (10)$$

Where $g^*$ is the update, $g_j$ is the vector of acoustic impedance value calculated from the actual borehole data for the particular CDP location j, $\delta$ is the step-size of Markov chain Monte Carlo process, and $\epsilon$ is the random sample from block 808.

Next, the illustrative method comprises upscaling the data (block 812). As discussed above, the seismic-based acoustic impedance traces have low vertical resolution, while the acoustic impedance traces calculated using the actual borehole data have high vertical resolution. Thus, prior to making a comparison to see how well the two acoustic impedance traces match, the data is upscaled (e.g., averaged) such that the data resolution is substantially the same. Thereafter, a comparison is made as between the acoustic impedance traces (block 814). In some cases, the comparison is by way of a Metropolis-Hastings sampling of the update calculated with respect to equation 10. The sampling criteria may be given by:

$$\alpha(g^*, g_j) = \min\left[1, \frac{q(g^j \mid g^*)f(g^*)}{q(g^* \mid g^j)f(g^j)}\right] \quad (11)$$

where $\alpha$ is the value indicative of how closely the data match, $f(g^*)$ represents the stationary distribution of the initial condition of Markov chain, while $q(g^* \mid g^j)$ represents a conditional probability distribution function for proposing new update candidates. In other words, a represents the probability for the transition from Markov chain state j to Markov chain state j+1. Thus the equation (11) means that $g^{j+1} = g^*$ with probability $\alpha(g^*, g_j)$ and $g^{j+1} = g^j$ with probability $(1-\alpha(g^*, g_j))$. Thus, the data saved is the high resolution data, not the upscaled data used in the illustrative Metropolis-Hastings sampling.

In the illustrative method of FIG. 8, the analysis is performed layer by layer, and thus a determination is made as to whether there are further layers (block 818). If all the layers of interest have been analyzed, the illustrative method ends (block 820). Although the discussion with respect to FIG. 8 is with respect to a single CDP location, the various steps are repeated for some or all the CDP locations.

Figure 9:
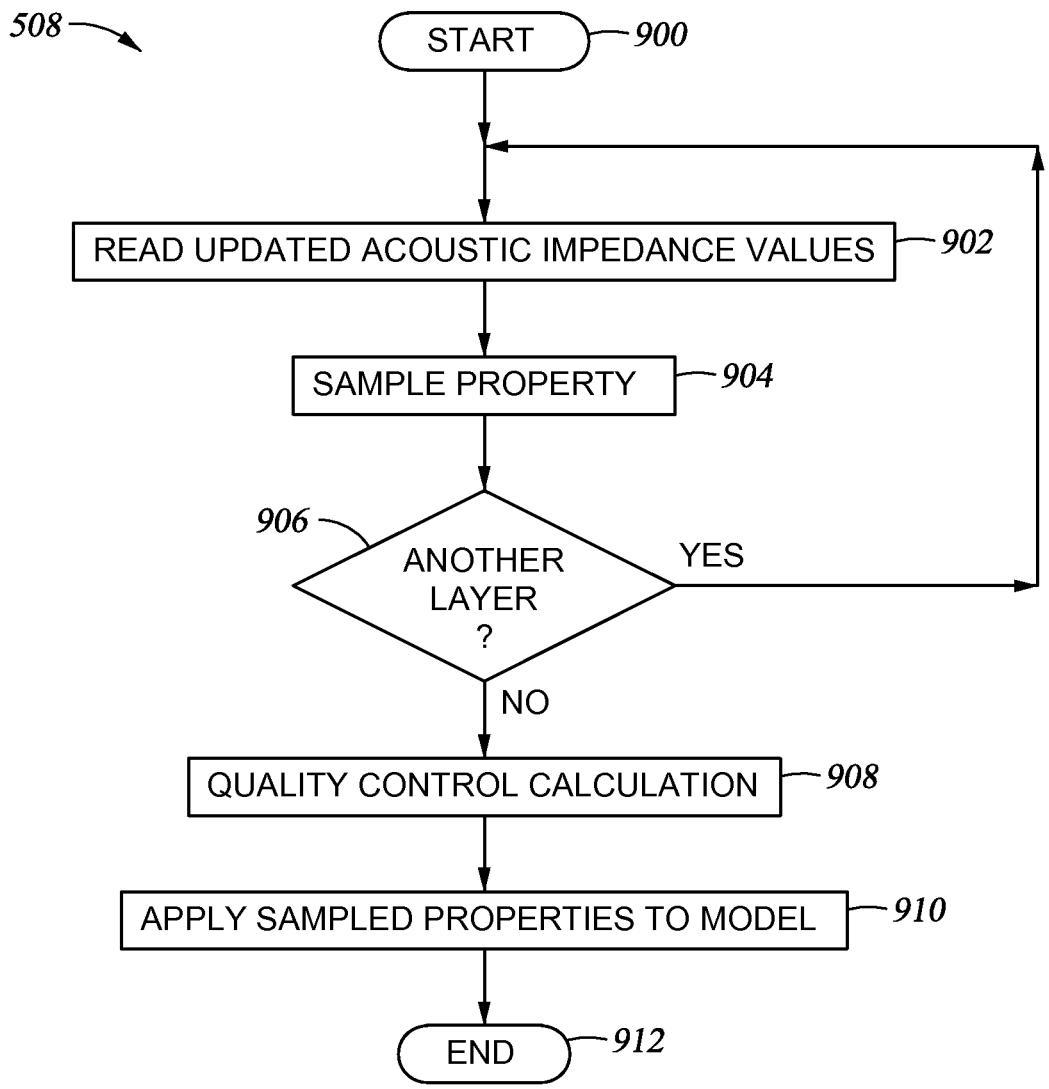
FIG. 9 shows a method in accordance with at least some embodiments.

The next step in the illustrative process is the update of reservoir properties (block 508) in the model. FIG. 9 shows a more detailed flow diagram of the illustrative steps involved in the update of the reservoir properties in the model, in accordance with at least some embodiments. In particular, the method starts (block 900), and for a particular CDP location, proceeds to reading an updated acoustic impedance value (block 902) for the particular layer. That is, the acoustic impedance value (and other values, such as density and thickness) for the particular layer at the particular CDP location (as may be saved in block 816) is read. From the data read, one or more properties are sampled (block 904). In other words, the property of interest is extracted.

In the illustrative method of FIG. 9, the updating is performed layer by layer, and thus a determination is made as to whether there are further layers (block 906). If all the layers of interest have been analyzed, the illustrative method proceeds to an optional quality control calculation (block 908). For example, in a particular embodiment the variograms and co-variances are recalculated using the new data. If significant differences exist between the variograms and co-variances previously calculation (block 502), then such is an indication that errors may have occurred in the processing.

Finally, the sampled properties are applied to the model (block 910), and the method ends (block 912). Although the discussion with respect to FIG. 9 is with respect to a single CDP location, the various steps are repeated for some or all the CDP locations. With respect to applying the sampled properties, in some cases the CDPs align with cells of the geocellular model. In such a case, the sampled properties are simply applied to the cells. In other cases, however, the cells of the geocellular model may not align with the CDPs (e.g., CDP locations have larger horizontal spacing). Application of the sampled properties to the model may thus utilize a interpolation technique (such as Kriging).

The various embodiments discussed to this point have assumed that acoustic impedance is used in the comparison between the seismic-based and borehole-based data; however, other properties may be equivalently used. For example, rigidity, bulk modulus (i.e., incompressibility), Lame's constant may all be used, singly, in combination as the property calculated and compared between the data types.

Figure 10:
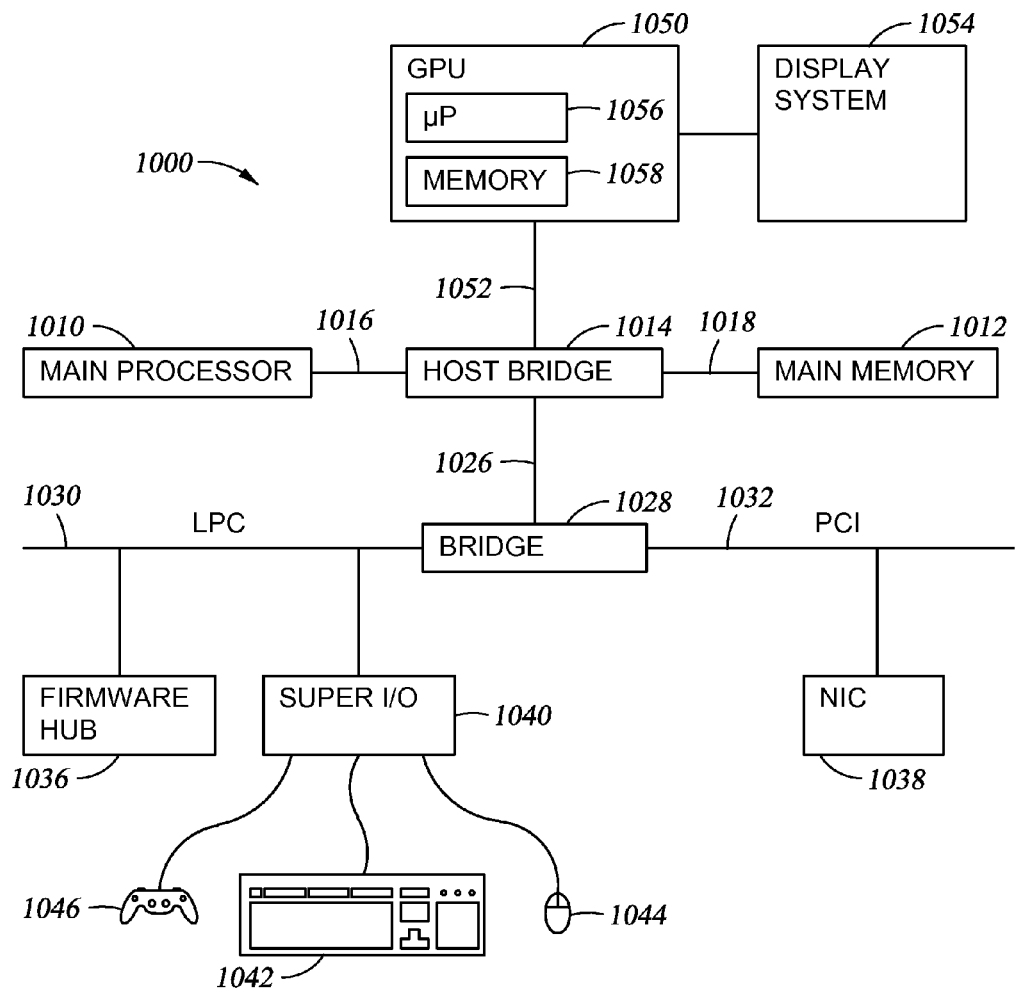
FIG. 10 shows a computer system in accordance with at least some embodiments.

FIG. 10 illustrates a computer system 1000 in accordance with at least some embodiments, and upon which at least some of the various methods may be implemented by way of software. In particular, computer system 1000 comprises a main processor 1010 coupled to a main memory array 1012, and various other peripheral computer system components, through integrated host bridge 1014. The main processor 1010 may be a single processor core device, or a processor implementing multiple processor cores. Furthermore, computer system 1000 may implement multiple main processors 1010. The main processor 1010 couples to the host bridge 1014 by way of a host bus 1016 or the host bridge 1014 may be integrated into the main processor 1010. Thus, the computer system 1000 may implement other bus configurations or bus-bridges in addition to, or in place of, those shown in FIG. 10.

The main memory 1012 couples to the host bridge 1014 through a memory bus 1018. Thus, the host bridge 1014 comprises a memory control unit that controls transactions to the main memory 1012 by asserting control signals for memory accesses. In other embodiments, the main processor 1010 directly implements a memory control unit, and the main memory 1012 may couple directly to the main processor 1010. The main memory 1012 functions as the working memory for the main processor 1010 and comprises a memory device or array of memory devices in which programs, instructions and data are stored. The main memory 1012 may comprise any suitable type of memory such as dynamic random access memory (DRAM) or any of the various types of DRAM devices such as synchronous DRAM (SDRAM), extended data output DRAM (EDODRAM), or Rambus DRAM (RDRAM). The main memory 1012 is an example of a non-transitory computer-readable medium storing programs and instructions, and other examples are disk drives and flash memory devices.

The illustrative computer system 1000 also comprises a second bridge 1028 that bridges the primary expansion bus 1026 to various secondary expansion buses, such as a low pin count (LPC) bus 1030 and peripheral components interconnect (PCI) bus 1032. Various other secondary expansion buses may be supported by the bridge device 1028. In accordance with some embodiments, the bridge device 1028 comprises an Input/Output Controller Hub (ICH) manufactured by Intel Corporation, and thus the primary expansion bus 1026 comprises a Hub-link bus, which is a proprietary bus of the Intel Corporation. However, computer system 1000 is not limited to any particular chip set manufacturer, and thus bridge devices and expansion bus protocols from other manufacturers may be equivalently used.

Firmware hub 1036 couples to the bridge device 1028 by way of the LPC bus 1030. The firmware hub 1036 comprises read-only memory (ROM) which contains software programs executable by the main processor 1010. The software programs comprise programs executed during and just after power on self tests (POST) procedures as well as memory reference code. The POST procedures and memory reference code perform various functions within the computer system before control of the computer system is turned over to the operating system.

The computer system 1000 further comprises a network interface card (NIC) 1038 illustratively coupled to the PCI bus 1032. The NIC 1038 acts as to couple the computer system 1000 to a communication network, such the Internet.

Still referring to FIG. 10, computer system 1000 may further comprise a super input/output (I/O) controller 1040 coupled to the bridge 1028 by way of the LPC bus 1030. The Super I/O controller 1040 controls many computer system functions, for example interfacing with various input and output devices such as a keyboard 1042, a pointing device 1044 (e.g., mouse), game controller 1046, various serial ports, floppy drives and disk drives. The super I/O controller 1040 is often referred to as "super" because of the many I/O functions it performs.

The computer system 1000 further comprises a graphics processing unit (GPU) 1150 coupled to the host bridge 1014 by way of bus 1052, such as a PCI Express (PCI-E) bus or Advanced Graphics Processing (AGP) bus. Other bus systems, including after-developed bus systems, may be equivalently used. Moreover, the graphics processing unit 1050 may alternatively couple to the primary expansion bus 1026, or one of the secondary expansion buses (e.g., PCI bus 1032). The graphics processing unit 1050 couples to a display system 1054 which may comprise any suitable electronic display device or multiple distinct display devices, upon which any image or text can be displayed. The graphics processing unit 1050 comprises an onboard processor 1056, as well as onboard memory 1058. The processor 1056 may thus perform graphics processing, as commanded by the main processor 1010. Moreover, the memory 1058 may be significant, on the order of several hundred gigabytes or more. Thus, once commanded by the main processor 1010, the graphics processing unit 1050 may perform significant calculations regarding graphics to be displayed on the display system, and ultimately display such graphics, without further input or assistance of the main processor 1010.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments, and/or to create a non-transitory computer-readable storage medium (i.e., other than an signal traveling along a conductor or carrier wave) for storing a software program to implement the method aspects of the various embodiments.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer-implemented method comprising:
    creating, by a computer system, a model of an underground formation, the model defining a plurality of modeled values for each of a plurality of horizontal locations within the underground formation, the creating comprising:
        calculating a set of probabilities indicative of a likelihood of finding abutting geological layers at a first horizontal location within the underground formation;
        estimating a plurality of successions of geological layers and a thickness or a porosity of each geological layer of each succession to create a plurality of estimated successions associated with the first horizontal location, based on the calculated set of probabilities;
        comparing each of the estimated successions with a measured succession of geological layers at the first horizontal location, as determined by a seismic survey of the underground formation; and
        selecting from among the plurality of estimated successions a succession of geological layers that most closely matches the measured succession, based on the comparison, wherein the selected succession of geological layers is used to define the plurality of modeled values for the first horizontal location.

2. The method as in claim 1 wherein calculating the set of probabilities further comprises:
    determining a first actual succession of geological layers penetrated by a first actual borehole;
    determining a second actual succession of geological layers penetrated by a second actual borehole; and
    calculating the set of probabilities based on the first and second actual successions of geological layers.

3. The method of claim 2 wherein calculating the set of probabilities further comprises adjusting the set of probabilities based on a distance of the first horizontal location from each of the first and second actual boreholes.

4. The method of claim 3, wherein each of the first and second actual boreholes are located within a predetermined distance of the first horizontal location, and adjusting the set of probabilities comprises weighting the set of probabilities according to a proximity of the first horizontal location relative to each of the first and second actual boreholes.

5. The method of claim 1,
    wherein estimating further comprises:
        estimating the thickness of each geological layer of each estimated succession;
        estimating the porosity of each geological layer of each estimated succession; and
        calculating a plurality of acoustic impedance traces for each of the estimated successions, based at least partly on the estimated thickness and porosity of each geological layer of each estimated succession, and
    wherein comparing further comprises determining, for each of the estimated successions, a value indicative of how closely each estimated succession matches the measured succession, based on the acoustic impedance trace calculated for the respective estimated succession relative to a seismic-based acoustic impedance trace determined from the seismic survey associated with the measured succession.

6. The method of claim 5 wherein calculating the plurality of acoustic impedance traces further comprises calculating such that each acoustic impedance trace has at least one acoustic impedance datum for every twelve inches of depth.

7. The method of claim 6 wherein calculating the plurality of acoustic impedance traces further comprises calculating such that each acoustic impedance trace has at least one acoustic impedance datum for six inches of depth.

8. The method of claim 5 further comprising averaging data within each acoustic impedance trace such that each acoustic impedance trace has no more than one acoustic impedance datum for each foot of depth.

9. The method of claim 8 wherein averaging further comprises averaging the data such that a data resolution of each calculated acoustic impedance trace substantially matches that of the seismic-based acoustic impedance trace associated with the measured succession.

10. The method of claim 5 wherein estimating further comprises:
    determining a first actual thickness of each geological layer at a location of a first actual borehole within the underground formation near the first horizontal location;
    determining a second actual thickness of each geological layer at a location of a second actual borehole within the underground formation near the first horizontal location; and
    performing interpolation to estimate the thickness of each geological layer of each estimated succession, based on the first and second actual thicknesses determined from the first and second actual boreholes.

11. The method of claim 1, wherein the calculating, estimating, comparing and selecting are repeated for each of the plurality of horizontal locations.

12. A computer system comprising:
    a processor; and
    a memory coupled to the processor that stores processor-executable instructions, which when executed by the processor, causes the processor to perform a plurality of functions, including functions to:
        calculate a set of probabilities indicative of a likelihood of finding abutting geological layers at a first horizontal location within an underground formation;

estimate a plurality of successions of geological layers and a thickness or a porosity of each geological layer of each succession to create a plurality of estimated successions associated with the first horizontal location, based on the calculated set of probabilities;

compare each of the estimated successions with a measured succession of geological layers at the first horizontal location, as determined by a seismic survey of the underground formation;

select from among the plurality of estimated successions a succession of geological layers that most closely matches the measured succession, based on the comparison; and define a plurality of modeled values for the first horizontal location within a model of the underground formation, based on the selected succession of geological layers.

13. The computer system of claim 12 wherein the functions performed by the processor further include functions to:
determine a first actual succession of geological layers penetrated by a first actual borehole;
determine a second actual succession of geological layers penetrated by a second actual borehole; and
calculate the set of probabilities based on the first and second actual successions of geological layers.

14. The computer system of claim 12 wherein the functions performed by the processor further include functions to adjust the set of probabilities based on a distance of the first horizontal location from each of the first and second actual boreholes.

15. The computer system of claim 11 wherein the functions performed by the processor further include functions to:
estimate the thickness of each geological layer of each estimated succession;
estimate the porosity of each geological layer of each estimated succession;
calculate a plurality of acoustic impedance traces for each of the estimated successions, based at least partly on the estimated thickness and porosity of each geological layer of each estimated succession; and
determine, for each of the estimated successions, a value indicative of how closely each estimated succession matches the measured succession, based on the acoustic impedance trace calculated for the respective estimated succession relative to a seismic-based acoustic impedance trace determined from the seismic survey associated with the measured succession.

16. The computer system of claim 15 wherein the functions performed by the processor further include functions to calculate the plurality of acoustic impedance traces such that each acoustic impedance trace has at least one acoustic impedance datum for every twelve inches of depth.

17. The computer system of claim 15 wherein the functions performed by the processor further include functions to calculate the plurality of acoustic impedance traces such that each acoustic impedance trace has at least one acoustic impedance datum for six inches of depth.

18. The computer system of claim 15 wherein the functions performed by the processor further include functions to average data within each calculated acoustic impedance trace such that each acoustic impedance trace has no more than one acoustic impedance datum for each foot of depth.

19. The computer system of claim 18 wherein the functions performed by the processor further include functions to average the data within each calculated acoustic impedance trace such that a data resolution of each calculated acoustic impedance trace substantially matches that of the seismic-based acoustic impedance trace associated with the measured succession.

20. The computer system of claim 15 wherein the functions performed by the processor further include functions to:
determine a first actual thickness of each geological layer at a location of a first actual borehole within the underground formation near the first horizontal location;
determine a second actual thickness of each geological layer at a location of a second actual borehole within the underground formation near the first horizontal location; and
perform interpolation to estimate the thickness of each geological layer of each estimated succession, based on the first and second actual thicknesses determined from the first and second actual boreholes.

21. A non-transitory computer readable medium storing processor executable instructions, which when executed by the processor, causes the processor to perform a plurality of functions, including functions to:
calculate a set of probabilities indicative of a likelihood of finding abutting geological layers at a first horizontal location within an underground formation;
estimate a plurality of successions of geological layers and a thickness or a porosity of each geological layer of each succession to create a plurality of estimated successions associated with the first horizontal location, based on the calculated set of probabilities;
compare each of the estimated successions with a measured succession of geological layers at the first horizontal location, as determined by a seismic survey of the underground formation;
select from among the plurality of estimated successions a succession of geological layers that most closely matches the measured succession, based on the comparison; and
define a plurality of modeled values for the first horizontal location within a model of the underground formation, based on the selected succession of geological layers.

22. The non-transitory computer readable of claim 21 wherein the functions performed by the processor further include functions to:
determine a first actual succession of geological layers penetrated by a first actual borehole;
determine a second actual succession of geological layers penetrated by a second actual borehole; and
calculate the set of probabilities based on the first and second actual successions of geological layers.

23. The non-transitory computer readable of claim 22 wherein the functions performed by the processor further include functions to adjust the set of probabilities based on a distance of the first horizontal location from each of the first and second actual boreholes.

24. The non-transitory computer readable of claim 21 wherein the functions performed by the processor further include functions to:
estimate the thickness of each geological layer of each estimated succession;
estimate the porosity of each geological layer of each estimated succession;
calculate a plurality of acoustic impedance traces for each of the estimated successions, based at least partly on the estimated thickness and porosity of each geological layer of each estimated succession; and
determine, for each of the estimated successions, a value indicative of how closely each estimated succession matches the measured succession, based on the acoustic impedance trace calculated for the respective estimated succession relative to a seismic-based acoustic impedance trace determined from the seismic survey associated with the measured succession.

25. The non-transitory computer readable of claim 24 wherein the functions performed by the processor further include functions to calculate the plurality of acoustic impedance traces such that each acoustic impedance trace has at least one acoustic impedance datum for every twelve inches of depth.

26. The non-transitory computer readable of claim 25 wherein the functions performed by the processor further include functions to calculate the plurality of acoustic impedance traces such that each acoustic impedance trace has at least one acoustic impedance datum for six inches of depth.

27. The non-transitory computer readable of claim 24 wherein the functions performed by the processor further include functions to average data within each calculated acoustic impedance trace such that each acoustic impedance trace has no more than one acoustic impedance datum for each foot of depth.

28. The non-transitory computer readable of claim 27 wherein the functions performed by the processor further include functions to average the data within each calculated acoustic impedance trace such that a data resolution of each calculated acoustic impedance trace substantially matches that of the seismic-based acoustic impedance trace associated with the measured succession.

29. The non-transitory computer readable of claim 24 wherein the functions performed by the processor further include functions to:
  determine a first actual thickness of each geological layer at a location of a first actual borehole within the underground formation near the first horizontal location;
  determine a second actual thickness of each geological layer at a location of a second actual borehole within the underground formation near the first horizontal location; and
  perform interpolation to estimate the thickness of each geological layer of each estimated succession, based on the first and second actual thicknesses determined from the first and second actual boreholes.

* * * * *